United States Patent
Kaneko et al.

(10) Patent No.: US 8,692,228 B2
(45) Date of Patent: *Apr. 8, 2014

(54) SEMICONDUCTOR LIGHT EMITTING DEVICE AND WAFER

(71) Applicants: Kei Kaneko, Kanagawa-ken (JP); Yasuo Ohba, Kanagawa-ken (JP); Hiroshi Katsuno, Tokyo (JP); Mitsuhiro Kushibe, Tokyo (JP)

(72) Inventors: Kei Kaneko, Kanagawa-ken (JP); Yasuo Ohba, Kanagawa-ken (JP); Hiroshi Katsuno, Tokyo (JP); Mitsuhiro Kushibe, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/671,578

(22) Filed: Nov. 8, 2012

(65) Prior Publication Data
US 2013/0112988 A1 May 9, 2013

Related U.S. Application Data

(62) Division of application No. 13/137,728, filed on Sep. 8, 2011, now Pat. No. 8,324,611, which is a division of application No. 12/505,053, filed on Jul. 17, 2009, now Pat. No. 8,039,830.

(30) Foreign Application Priority Data

Sep. 9, 2008 (JP) .................................. 2008-231097

(51) Int. Cl.
*H01L 29/06* (2006.01)

(52) U.S. Cl.
USPC .............. 257/15; 257/E33.009; 257/E33.008; 257/13; 257/14

(58) Field of Classification Search
USPC .......... 257/E33.009, E33.01, 13–15, E33.008
See application file for complete search history.

(56) References Cited

U.S. PATENT DOCUMENTS 7,095,051 B2   8/2006 Nagahama et al.
7,230,263 B2 * 6/2007 Kawagoe ........................ 257/13

(Continued)

FOREIGN PATENT DOCUMENTS

JP       2713094       10/1997
JP      2000-31588      1/2000

(Continued)

OTHER PUBLICATIONS

Kwon et al., "Si Delta Doping in a GaN Barrier Layer of InGaN/GaN Multiquantum Well for an Efficient Ultraviolet Light-Emitting Diode", Journal of Applied Physics, vol. 97, pp. 106109-1 through 106109-3, (2005).

(Continued)

*Primary Examiner* — Yu-Hsi D Sun
(74) *Attorney, Agent, or Firm* — Finnegan, Henderson, Farabow, Garrett & Dunner, L.L.P.

(57) ABSTRACT

A semiconductor light emitting device includes a first layer including at least one of n-type GaN and n-type AlGaN; a second layer including Mg-containing p-type AlGaN; and a light emitting section provided between the first and second layers. The light emitting section includes barrier layers of Si-containing $Al_xGa_{1-x-y}In_yN$ ($0 \leq x$, $0 \leq y$, $x+y \leq 1$), and a well layer provided between the barrier layers and made of GaInN or AlGaInN. The barrier layers have a nearest barrier layer nearest to the second layer among the barrier layers and a far barrier layer. The nearest barrier layer includes a first portion made of Si-containing $Al_xGa_{1-x-y}In_yN$ ($0 \leq x$, $0 \leq y$, $x+y \leq 1$), and a second portion provided between the first portion and the second layer and made of $Al_xGa_{1-x-y}In_yN$ ($0 \leq x$, $0 \leq y$, $x+y \leq 1$). The Si concentration in the second portion is lower than those in the first portion and in the far barrier layer.

7 Claims, 5 Drawing Sheets

(56) References Cited

U.S. PATENT DOCUMENTS

| | | | |
|---|---|---|---|
| 2002/0190259 A1* | 12/2002 | Goetz et al. | 257/79 |
| 2007/0034883 A1* | 2/2007 | Ohba | 257/85 |
| 2009/0206322 A1* | 8/2009 | Brandes | 257/13 |

FOREIGN PATENT DOCUMENTS

| | | |
|---|---|---|
| JP | 2000-164922 | 6/2000 |
| JP | 2000-332364 | 11/2000 |
| JP | 2001-148507 | 5/2001 |
| JP | 2003-273473 | 9/2003 |
| JP | 2004-31770 | 1/2004 |
| JP | 2004-87908 | 3/2004 |
| JP | 2005-101542 | 4/2005 |
| JP | 2007-299848 | 11/2007 |
| JP | 2008-311658 | 12/2008 |
| WO | WO 2004-047245 A1 | 6/2004 |

OTHER PUBLICATIONS

Ohba et al., U.S. Appl. No. 12/507,539, filed Jul. 22, 2009, entitled Method for Manufacturing Semiconductor Light Emitting Device.
Notification of Reason(s) for Refusal issued by the Japanese Patent Office on May 24, 2012, for Japanese Patent Application No. 2008-231097, and English-language translation thereof.

* cited by examiner

SEMICONDUCTOR LIGHT EMITTING DEVICE AND WAFER

CROSS-REFERENCE TO RELATED APPLICATIONS

This is a divisional application of U.S. patent application Ser. No. 13/137,728, filed Sep. 8, 2011, which is a divisional application of U.S. patent application Ser. No. 12/505,053, filed Jul. 17, 2009 (now U.S. Pat. No. 8,039,830 B2, issued Oct. 18, 2011), which are incorporated herein by reference.

BACKGROUND OF THE INVENTION

1. Field of the Invention

This invention relates to a semiconductor light emitting device and a wafer.

2. Background Art

A near-ultraviolet LED (light emitting diode) device (emission wavelength being 400 nm or less) based on a nitride semiconductor is expected to serve as a light source for use in a white LED, but has the problem of low optical efficiency. As opposed to LD (laser diode), the emission efficiency of an LED device does not exceed the emission efficiency of its light emitting section. To increase the emission efficiency of the light emitting section, attempts have been made to fabricate a device based on a GaN substrate with low dislocation density. However, this is not a widely available technique because of its high cost in addition to low efficiency.

Conventionally, it has been considered that the low emission efficiency of an ultraviolet LED device is caused mainly by the large number of crystal defects such as dislocations in the light emitting layer. In this context, a growth technique is developed, in which a GaN layer is formed on a sapphire c-plane substrate via a buffer layer formed from high Al composition AlGaN or AlN by high-temperature growth. This technique can reduce the dislocation density to $10^8$-$10^9$ m$^{-3}$, which is lower by 1/10 or less than conventional. However, near-ultraviolet LED devices based on this technique also have room for improvement.

Japanese Patent No. 2713094 discloses a technique for increasing emission efficiency using a double heterostructure in which an n-type gallium nitride-based compound semiconductor layer serves as a first cladding layer, an In$_x$Ga$_{1-x}$N layer doped with a specific amount of Si serves as a light emitting layer, and a p-type gallium nitride-based compound semiconductor layer doped with a specific amount of Mg serves as a second cladding layer.

SUMMARY OF THE INVENTION

According to an aspect of the invention, there is provided a semiconductor light emitting device including: a first layer made of at least one of n-type GaN and n-type AlGaN; a second layer made of Mg-containing p-type AlGaN; and a light emitting section provided between the first layer and the second layer, the light emitting section including a plurality of barrier layers made of Si-containing Al$_x$Ga$_{1-x-y}$In$_y$N (0≤x, 0≤y, x+y≤1), and a well layer provided between each pair of the plurality of barrier layers and made of GaInN or AlGaInN, the plurality of barrier layers having a nearest barrier layer and a far barrier layer, the nearest barrier layer being nearest to the second layer among the plurality of barrier layers, the nearest barrier layer including a first portion made of Si-containing Al$_x$Ga$_{1-x-y}$In$_y$N (0≤x, 0≤y, x+y≤1), and a second portion provided between the first portion and the second layer and made of Al$_x$Ga$_{1-x-y}$In$_y$N (0≤x, 0≤y, x+y≤1), a Si concentration in the second portion being lower than a Si concentration in the first portion and lower than a Si concentration in the far barrier layer.

According to another aspect of the invention, there is provided a semiconductor light emitting device including: a first layer made of at least one of n-type GaN and n-type AlGaN; a second layer made of Mg-containing p-type AlGaN; and a light emitting section provided between the first layer and the second layer and including a plurality of barrier layers made of Si-containing Al$_x$Ga$_{1-x-y}$In$_y$N (0≤x, 0≤y, x+y≤1), and a well layer provided between each pair of the plurality of barrier layers and made of GaInN or AlGaInN, each of the barrier layers sandwiched between the well layers including a third portion provided on the first layer side and made of Si-containing Al$_x$Ga$_{1-x-y}$In$_y$N (0≤x, 0≤y, x+y≤1), and a fourth portion provided on the second layer side and made of Al$_x$Ga$_{1-x-y}$In$_y$N (0≤x, 0≤y, x+y≤1), a Si concentration in the fourth portion being higher than Si concentration in the third portion.

According to another aspect of the invention, there is provided a wafer including: a first layer made of at least one of n-type GaN and n-type AlGaN; a second layer made of Mg-containing p-type AlGaN; and a light emitting section provided between the first layer and the second layer, the light emitting section including a plurality of barrier layers made of Si-containing Al$_x$Ga$_{1-x-y}$In$_y$N (0≤x, 0≤y, x+y≤1), and a well layer provided between each pair of the plurality of barrier layers and made of GaInN or AlGaInN, the plurality of barrier layers having a nearest barrier layer and a far barrier layer, the nearest barrier layer being nearest to the second layer among the plurality of barrier layers, the nearest barrier layer including a first portion made of Si-containing Al$_x$Ga$_{1-x-y}$In$_y$N (0≤x, 0≤y, x+y≤1), and a second portion provided between the first portion and the second layer and made of Al$_x$Ga$_{1-x-y}$In$_y$N (0≤x, 0≤y, x+y≤1), a Si concentration in the second portion being lower than a Si concentration in the first portion and lower than a Si concentration in the far barrier layer.

According to another aspect of the invention, there is provided a wafer including: a first layer made of at least one of n-type GaN and n-type AlGaN; a second layer made of Mg-containing p-type AlGaN; and a light emitting section provided between the first layer and the second layer and including a plurality of barrier layers made of Si-containing Al$_x$Ga$_{1-x-y}$In$_y$N (0≤x, 0≤y, x+y≤1), and a well layer provided between each pair of the plurality of barrier layers and made of GaInN or AlGaInN, each of the barrier layers sandwiched between the well layers including a third portion provided on the first layer side and made of Si-containing Al$_x$Ga$_{1-x-y}$In$_y$N (0≤x, 0≤y, x+y≤1), and a fourth portion provided on the second layer side and made of Al$_x$Ga$_{1-x-y}$In$_y$N (0≤x, 0≤y, x+y≤1), a Si concentration in the fourth portion being higher than Si concentration in the third portion.

DETAILED DESCRIPTION OF THE INVENTION

Embodiments of the invention will now be described with reference to the drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification and the drawings, the same elements as those described previously with reference to earlier figures are labeled with like reference numerals, and the detailed description thereof is omitted as appropriate.

First Embodiment

Figure 1:
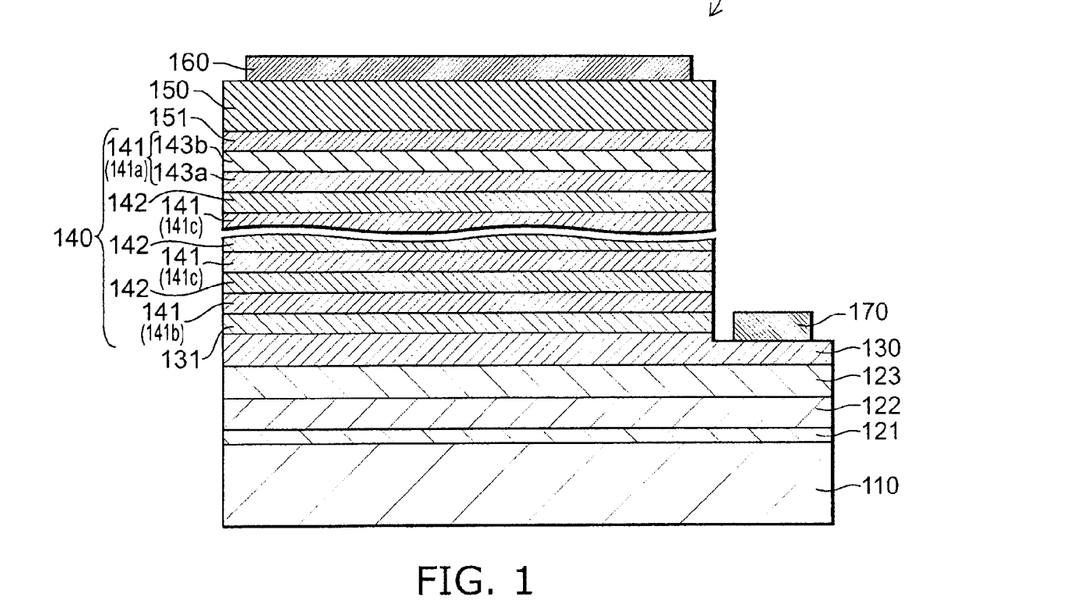
FIG. 1 is a schematic cross-sectional view illustrating the configuration of a semiconductor light emitting device according to a first embodiment of the invention.

FIG. 1 is a schematic cross-sectional view illustrating the configuration of a semiconductor light emitting device according to a first embodiment of the invention.

As shown in FIG. 1, the semiconductor light emitting device 10 according to the first embodiment of the invention illustratively has a structure formed by stacking, on a substrate 110 having a sapphire c-plane surface, a first buffer layer 121 made of highly carbon-doped AlN, a second buffer layer 122 made of high-purity AlN, a lattice-relaxed layer 123 made of non-doped GaN, an n-type contact layer 130 made of Si-doped n-type GaN, an n-type confinement layer (first layer) 131 made of Si-doped n-type AlGaN, a light emitting section 140, a p-type confinement layer (second layer) 151 made of Mg-doped p-type AlGaN, and a p-type contact layer (third layer) 150 made of Mg-doped p-type GaN.

The p-type contact layer 150 is provided with a p-side electrode 160 illustratively made of Au, and the n-type contact layer 130 is provided with an n-side electrode 170 illustratively made of Ti/Pt/Au.

The n-type confinement layer 131 can be made of at least one of n-type GaN and n-type AlGaN.

The light emitting section 140 has a multiple quantum well structure in which a barrier layer 141 made of Si-doped n-type AlGaInN and a well layer 142 made of GaInN are alternately stacked six times.

Here, the aforementioned AlGaInN is $Al_xGa_{1-x-y}In_yN$ ($0 \le x$, $0 \le y$, $x+y \le 1$).

The well layer 142 can be made of not only GaInN but also AlGaInN.

In other words, the light emitting section 140 includes a plurality of barrier layers 141 provided between the n-type confinement layer 131 and the p-type confinement layer 151 and made of Si-containing $Al_xGa_{1-x-y}In_yN$ ($0 \le x$, $0 \le y$, $x+y \le 1$), and a well layer 142 provided between each pair of the plurality of barrier layers 141 and made of GaInN or AlGaInN.

Here, of the barrier layers 141, the one nearest the p-type confinement layer 151 is referred to as "p-side barrier layer 141a". Furthermore, of the barrier layers 141, the one nearest the n-type confinement layer 131 is referred to as "n-side barrier layer 141b". Furthermore, the barrier layers 141 except the p-side barrier layer 141a and the n-side barrier layer 141b, that is, the barrier layers 141 sandwiched between the well layers 142, are referred to as "inner barrier layers 141c". In other words, the plurality of barrier layers 141 have a nearest barrier layer and a far barrier layer. The nearest barrier layer is nearest to the second layer among the plurality of barrier layers. In this case, the nearest barrier layer is the p-side barrier layer 141a. The far barrier layers include the n-side barrier layer 141b and the inner barrier layers 141c.

In the semiconductor light emitting device 10 according to this embodiment, the p-side barrier layer 141a has a distributed Si concentration. That is, the p-side barrier layer 141a has a high Si concentration on the well layer 142 side and a low Si concentration on the p-type confinement layer 151 side.

More specifically, the p-side barrier layer 141a includes a layered first portion 143a made of Si-containing $Al_xGa_{1-x-y}In_yN$ ($0 \le x$, $0 \le y$, $x+y \le 1$) and a layered second portion 143b provided between the first portion 143a and the p-type confinement layer 151 and made of $Al_xGa_{1-x-y}In_yN$ ($0 \le x$, $0 \le y$, $x+y \le 1$) which contains Si at a concentration lower than the Si concentration in the first portion 143a.

Here, the Si concentration in the second portion 143b is lower than the Si concentration in the barrier layers 141 except the p-side barrier layer 141a, that is, in the n-side barrier layer 141b and the inner barrier layers 141c.

The Si concentration in the first portion 143a can be not more than the Si concentration in the barrier layers 141 except the p-side barrier layer 141a, that is, in the n-side barrier layer 141b and the inner barrier layers 141c. In other words, the Si concentration in the first portion 143a can be comparable to or lower than the Si concentration in the n-side barrier layer 141b and the inner barrier layers 141c.

That is, in the semiconductor light emitting device 10 according to this embodiment, the Si concentration is relatively high in the n-side barrier layer 141b, the inner barrier layers 141c, and the first portion 143a, and relatively low in the second portion 143b.

In the following, an example configuration of the various layers described above is presented. However, the invention is not limited thereto, but can be variously modified.

The first buffer layer 121 can have, for instance, a carbon concentration of $1 \times 10^{19}$-$5 \times 10^{20}$ cm$^{-3}$ and a thickness of 3-20 nm.

The second buffer layer 122 can have, for instance, a carbon concentration of $1 \times 10^{16}$–$1 \times 10^{19}$ cm$^{-3}$ and a thickness of approximately 2 µm.

The lattice-relaxed layer 123 can have a thickness of e.g. 2 µm.

The n-type contact layer 130 can have, for instance, a Si concentration of $1 \times 10^{19}$-$2 \times 10^{19}$ cm$^{-3}$ and a thickness of approximately 4 µm.

The n-type confinement layer 131 can be illustratively made of Si-doped n-type $Al_{0.13}Ga_{0.87}N$ with a Si concentration of $2 \times 10^{18}$ cm$^{-3}$ and a thickness of 0.03 µm.

The p-type confinement layer 151 can be illustratively made of Mg-doped p-type $Al_{0.25}Ga_{0.75}N$ with a thickness of 24 nm.

Furthermore, in the p-type confinement layer 151, for instance, the Mg concentration can be $3\times10^{19}$ cm$^{-3}$ on the second portion 143b side, and $1\times10^{19}$ cm$^{-3}$ on the surface side (on the opposite side from the second portion 143b, i.e., on the p-side electrode 160 side).

In the p-type contact layer 150, the Mg concentration can be $1\times10^{19}$ cm$^{-3}$ on the p-type confinement layer 151 side, and $5-9\times10^{19}$ cm$^{-3}$ on the surface side (on the opposite side from the p-type confinement layer 151, i.e., on the p-side electrode 160 side).

The well layer 142 of the light emitting section 140 can be illustratively made of GaInN, and the peak wavelength of light emitted from the light emitting section 140 can be in the near-ultraviolet region, 370-400 nm (370 nanometers or more and 400 nanometers or less).

The n-side barrier layer 141b and the inner barrier layer 141c can be illustratively made of Si-doped n-type $Al_{0.065}Ga_{0.93}In_{0.005}N$ with a Si concentration of $1.1-3.0\times10^{19}$ cm$^{-3}$ and a thickness of approximately 13.5 nm.

In the p-side barrier layer 141a, the first portion 143a on the well layer 142 side can be made of Si-doped n-type $Al_{0.065}Ga_{0.93}In_{0.005}N$ with a Si concentration of $1.1-3.0\times10^{19}$ cm$^{-3}$ like the n-side barrier layer 141b and the inner barrier layer 141c, but with a thickness of approximately 4.5 nm.

On the other hand, the second portion 143b with low Si concentration can be illustratively an $Al_{0.65}Ga_{0.93}In_{0.005}N$ layer with a Si concentration of $1\times10^{16}-3\times10^{18}$ cm$^{-3}$ and a thickness of approximately 4.5 nm.

That is, the semiconductor light emitting device 10 includes an n-type confinement layer 131 made of at least one of n-type GaN and n-type AlGaN; a p-type confinement layer 151 made of Mg-containing p-type AlGaN; and a light emitting section 140 including a plurality of barrier layers 141 provided between the n-type confinement layer 131 and the p-type confinement layer 151 and made of Si-containing $Al_xGa_{1-x-y}In_yN$ ($0\leq x$, $0\leq y$, $x+y\leq1$), and a well layer 142 provided between each pair of the plurality of barrier layers 141 and made of GaInN or AlGaInN.

In the light emitting section 140, the barrier layer 141 (p-side barrier layer 141a) nearest the p-type confinement layer 151 includes a first portion 143a made of Si-containing $Al_xGa_{1-x-y}In_yN$ ($0\leq x$, $0\leq y$, $x+y\leq1$) and a second portion 143b provided between the first portion 143a and the p-type confinement layer 151 and made of $Al_xGa_{1-x-y}In_yN$ ($0\leq x$, $0\leq y$, $x+y\leq1$) which contains Si at a concentration lower than the Si concentration in the first portion 143a.

In the semiconductor light emitting device 10 thus configured, in the barrier layer (p-side barrier layer 141a) nearest the p-type confinement layer 151, the second portion 143b containing Si at a lower concentration than the rest is provided on the p-type confinement layer 151 side. Thus, this embodiment can provide a semiconductor light emitting device achieving near-ultraviolet emission with high efficiency.

In the following, the operation of the semiconductor light emitting device 10 according to this embodiment is described.

The heterojunction of a GaN mixed crystal has small discontinuity on the valence band side, and the effect of confining holes is accordingly weak. Hence, to improve the efficiency of the light emitting section 140, it is considered important to strongly confine holes, which are minority carriers, in the well layer 142.

To enhance hole confinement using band curvature, the barrier layer 141 was doped with Si at a high concentration of $1.1\times10^{19}$ cm$^{-3}$ or more. It was then found that the emission efficiency can be increased in photoluminescence (PL). Here, by using a crystal with low dislocation density based on a high-temperature grown AlN buffer layer, high crystal quality can be maintained even if the barrier layer 141 is highly doped with Si.

However, in the case where the barrier layer 141 in an LED device was highly doped with Si as described above, sufficiently high efficiency was not achieved.

This was presumably because doping with Si at high concentration increased the electron concentration and caused electrons to overflow into the p-type semiconductor layer.

Thus, to prevent the overflow of electrons, attempts were made to increase the thickness of the p-type confinement layer 151 formed on the light emitting section 140 while increasing the Al composition ratio of the p-type confinement layer 151 to control energy in the p-type confinement layer 151.

Here, in an LED device based on a nitride semiconductor which emits ultraviolet or other short-wavelength light, the Mg concentration in the p-type confinement layer 151 is made higher than in a long-wavelength LED device so that the operating voltage falls within a practical range. This is because a nitride semiconductor has a low hole mobility and a low carrier density, which result in increasing the operating voltage unless the Mg concentration of the p-type confinement layer 151 is increased. That is, the piezoelectric field applied to the p-type confinement layer 151 hampers electric conduction and increases the operating voltage. To cancel this piezoelectric field, a Mg concentration of e.g. $1\times10^{19}$ cm$^{-3}$ or more is required.

Under the condition that the thickness of the p-type confinement layer 151 was increased with its Al composition ratio increased, the Mg concentration was increased to study the relationship between Mg concentration and emission efficiency. However, also in this case, the emission efficiency was low.

To investigate the cause of the failure to increase the emission efficiency, SIMS analysis was performed on the LED device. Then, in the p-type confinement layer 151, the Mg concentration exhibited a peculiar distribution being high on the light emitting section 140 side and low on the surface side, and Mg was diffused into the light emitting section 140. It was presumed that the emission efficiency was not increased because of this diffusion of Mg into the light emitting section 140.

This analysis result suggested that the peculiar distribution of Mg was ascribable not only to heat, but also to other factors.

Through various experiments, the inventors have found that the Mg distribution in the neighborhood of the interface between the p-type confinement layer 151 and the light emitting section 140 is strongly affected by the Si concentration of the barrier layer 141 (p-side barrier layer 141a) in contact with the p-type confinement layer 151. More specifically, if the p-side barrier layer 141a has a high Si concentration, the electric field due to the resulting built-in potential concentrates on the p-type confinement layer 151 and causes Mg atoms in the p-type confinement layer 151 to drift into the light emitting section 140, thereby causing the anomalous diffusion of Mg. Thus, in the near-ultraviolet LED device, the diffusion of Mg with which the p-type confinement layer 151 is doped is significantly affected by the aforementioned electric field in the neighborhood of the interface between the p-type confinement layer 151 and the light emitting section 140.

This invention has been accomplished on the basis of the above findings, and the semiconductor light emitting device 10 according to this embodiment has a structure capable of controlling the aforementioned electric field.

More specifically, the inventors have succeeded in increasing the emission efficiency by allowing the Si concentration on the p-type confinement layer 151 side of the p-side barrier layer 141a to be lower than the Si concentration on the well layer 142 side. For instance, the second portion 143b is not doped with Si, whereas the first portion 143a is doped with Si at high concentration.

The second portion 143b with low Si concentration serves to avoid the aforementioned electric field which otherwise induces Mg diffusion. This prevents the anomalous diffusion of Mg into the light emitting section 140, allowing the p-type confinement layer 151 to be highly doped with Mg. Thus, the resistance of the p-type confinement layer 151 is decreased, and consequently the emission efficiency can be increased.

By either increasing the thickness of the p-type confinement layer 151 or increasing its Al composition ratio, the overflow of electrons can be avoided. This allows the barrier layer 141 to be highly doped with Si, and holes can be strongly confined in the well layer 142. Consequently, the emission efficiency can be further increased.

Here, the well layer 142 side of the p-side barrier layer 141a is highly doped with Si, which serves to strongly confine holes in the well layer 142.

Furthermore, because the effect of the second portion 143b with low concentration to prevent the anomalous diffusion of Mg allows the p-type confinement layer 151 to be highly doped with Mg, the operating voltage can be decreased, which also results in the effect of improving reliability.

More specifically, in the semiconductor light emitting device 10 according to this embodiment, a second portion 143b with low Si concentration is provided on the p-type confinement layer 151 side of the p-side barrier layer 141a. The electric field due to the built-in potential caused by the high Si concentration of the n-type semiconductor layer concentrates on the p-type confinement layer 151 and causes Mg atoms to drift into the light emitting section 140, thereby causing the anomalous diffusion of Mg. The second portion 143b serves to prevent this anomalous diffusion of Mg, and consequently the emission efficiency can be increased. Furthermore, the resistance of the p-type confinement layer 151 can be decreased, which serves to decrease the operating voltage and improve reliability.

Thus, the second portion 143b is provided to decrease the electron concentration in the vicinity of the interface with the p-type confinement layer 151 and prevent the electron overflow into the p-type confinement layer 151. Here, simultaneously, the hole concentration in the vicinity of the interface also increases, and hence non-radiative recombination at the interface also increases. However, this loss is low and effectively irrelevant because of low dislocation density and use of AlGaInN quaternary mixed crystal for the barrier layer 141.

Thus, this embodiment can provide a semiconductor light emitting device 10 achieving near-ultraviolet emission with high efficiency.

The semiconductor light emitting device 10 according to this embodiment can be fabricated as follows, for instance.

First, on a substrate 110 having a sapphire c-plane surface, metal organic vapor phase growth is used to stack a highly carbon-doped AlN film (carbon concentration $1 \times 10^{19}$-$5 \times 10^{20}$ cm$^{-3}$) with a thickness of 3-20 nm serving as a first buffer layer 121, a high-purity AlN film with a carbon concentration of $1 \times 10^{16}$-$1 \times 10^{19}$ cm$^{-3}$ and a thickness of 2 µm serving as a second buffer layer 122, a non-doped GaN film with a thickness of 2 µm serving as a lattice-relaxed layer 123, a Si-doped n-type GaN film with a Si concentration of $1 \times 10^{19}$-$2 \times 10^{19}$ cm$^{-3}$ and a thickness of 4 µm serving as an n-type contact layer, and a Si-doped n-type $Al_{0.13}Ga_{0.87}N$ film with a Si concentration of $2 \times 10^{18}$ cm$^{-3}$ and a thickness of 0.02 µm serving as an n-type confinement layer 131. Then, a Si-doped n-type $Al_{0.065}Ga_{0.93}In_{0.005}N$ film with a Si concentration of $1.1$-$3 \times 10^{19}$ cm$^{-3}$ and a thickness of 13.5 nm serving as a barrier layer 141 (n-side barrier layer 141b and inner barrier layer 141c) and a GaInN film with a thickness of 4.5 nm serving as a well layer 142 are alternately stacked six times (except that a highly Si-doped n-type $Al_{0.065}Ga_{0.93}In_{0.005}N$ film with a Si concentration of $1.1$-$3.0 \times 10^{19}$ cm$^{-3}$ serving as a first portion 141a has a thickness of 4.5 nm), and an $Al_{0.065}Ga_{0.93}In_{0.005}N$ film with a Si concentration of $1 \times 10^{16}$-$3 \times 10^{18}$ cm$^{-3}$ and a thickness of 4.5 nm serving as a second portion 143b, a Mg-doped p-type $Al_{0.25}Ga_{0.75}N$ film with a thickness of 24 nm serving as a p-type confinement layer 151 (the Mg concentration is $1.8 \times 10^{19}$ cm$^{-3}$ on the second portion 143b side, and $1 \times 10^{19}$ cm$^{-3}$ on the surface side), and a Mg-doped p-type GaN film serving as a p-type contact layer 150 (the Mg concentration is $1 \times 10^{19}$ cm$^{-3}$ on the p-type confinement layer 151 side, and $5$-$9 \times 10^{19}$ cm$^{-3}$ on the surface side) are sequentially stacked.

Next, these semiconductor layers are provided with electrodes by the method illustrated below.

First, as shown in FIG. 1, in a partial region of these semiconductor layers, using a mask, the p-type semiconductor layers and the light emitting section 140 are removed by dry etching to expose the n-type contact layer 130 to the surface. Then, entirely on the semiconductor layers including the exposed n-type semiconductor layer, a SiO$_2$ film, not shown, is formed to a thickness of 400 nm using a thermal CVD (chemical vapor deposition) apparatus.

Then, to form a p-side electrode 160, first, a patterned resist for resist lift-off is formed on the semiconductor layer, and the SiO$_2$ film on the p-type contact layer 150 is removed by ammonium fluoride treatment. Then, on the region from which the SiO$_2$ film has been removed, a reflective conductive Ag film serving as a p-side electrode 160 is formed to a thickness of 200 nm using a vacuum evaporation apparatus, for instance, and sintered for 1 minute in a nitrogen atmosphere at 350° C.

Then, to form an n-side electrode 170, a patterned resist for resist lift-off is formed on the semiconductor layer, and the SiO$_2$ film on the exposed n-type contact layer 130 is removed by ammonium fluoride treatment. On the region from which the SiO$_2$ film has been removed, a multilayer film illustratively made of Ti/Pt/Au is formed to a thickness of 500 nm to provide an n-side electrode 170.

Alternatively, it is also possible to use a high-reflectance silver alloy (e.g., containing Pd at approximately 1%). In this case, for good ohmic contact, the n-type contact layer is formed as a bilayer structure, in which a highly-doped layer with a Si concentration of $1.5 \times 10^{19}$-$3 \times 10^{19}$ cm$^{-3}$ is grown to approximately 0.3 µm as an electrode formation portion. This can prevent reliability decrease due to precipitation of Si.

Next, backside polishing, and cutting by cleavage or a diamond blade and the like are performed. Thus, an individual LED device illustratively having a width of 400 µm and a thickness of 100 µm, that is, the semiconductor light emitting device 10 according to this embodiment, is fabricated.

In the foregoing, the highly carbon-doped buffer layer (first buffer layer 121) can be epitaxially grown by low-pressure metal organic vapor phase growth with a group V/group III raw material ratio from 0.7 to 50.

The other buffer layers (at least one of the second buffer layer 122 and the lattice-relaxed layer 123) can be epitaxially grown by metal organic vapor phase growth at a higher temperature and a higher group V/group III raw material ratio than the epitaxial growth of the highly carbon-doped buffer layer (first buffer layer 121).

The semiconductor light emitting device 10 according to this embodiment includes at least an n-type semiconductor layer, a p-type semiconductor layer, and a semiconductor layer including a light emitting section 140 sandwiched between the n-type semiconductor layer and the p-type semiconductor layer. The material of the semiconductor layers is not particularly limited, but can be illustratively made of a gallium nitride-based compound semiconductor such as $Al_xGa_{1-x-y}In_yN$ (x≥0, y≥0, x+y≤1).

The method for forming these semiconductor layers is not particularly limited, but can be based on such techniques as metal organic vapor phase growth and molecular beam epitaxial growth.

The material of the substrate 110 is not particularly limited, but the substrate 110 can be a substrate of sapphire, SiC, GaN, GaAs, Si and the like. The substrate 110 may be finally removed.

In order to achieve highly efficient emission in the near-ultraviolet range by taking advantage of low-defect crystal, the semiconductor light emitting device 10 according to this embodiment is based on various techniques to facilitate increasing the efficiency of the light emitting section 140 itself and using the p-type confinement layer 151 having a high Al composition and a large thickness to prevent overflow of electrons from the light emitting section 140.

In the following, the high-temperature grown buffer layers (first and second buffer layer 121, 122, and lattice-relaxed layer 123), the barrier layer 141, the well layer 142, and the p-type confinement layer 151 in the semiconductor light emitting device 10 according to this embodiment are described in detail.

The first buffer layer 121 made of highly carbon-doped AlN serves to relax the difference in crystal type from the substrate 110, particularly to decrease screw dislocations. The thickness of the first buffer layer 121 can be 3 nm or more and 20 nm or less.

The second buffer layer 122 made of high-purity AlN has a surface planarized at the atomic level to serve to maximize the effect of the lattice-relaxed layer 123 made of GaN, which is grown thereon and serves for defect reduction and strain relaxation. To this end, the thickness of the second buffer layer 122 is preferably larger than 0.8 µm. Furthermore, to prevent warpage due to strain, the thickness is preferably 4 µm or less.

That is, the buffer layers can include a second buffer layer 122 provided above the substrate 110 and made of single crystal AlN, and a first buffer layer 121 provided between the second buffer layer 122 and the substrate 110, made of single crystal AlN, having a higher carbon concentration than the second buffer layer 122, and having a thickness of 3 nm or more and 20 nm or less.

While the second buffer layer 122 can be made of AlN, the invention is not limited thereto. For instance, $Al_xGa_{1-x}N$ (0.8≤x≤1) can be used. In this case, the Al composition can be adjusted to compensate for the wafer warpage.

The lattice-relaxed layer 123 serves for defect reduction and strain relaxation by three-dimensional island growth on the second buffer layer 122. To planarize the growth surface, the average thickness of the lattice-relaxed layer 123 needs to be 0.6 µm or more. From the viewpoint of reproducibility and warpage reduction, the thickness of the lattice-relaxed layer 123 is preferably 0.8-2 µm.

By using these buffer layers, the dislocation density can be made 1/10 or less of that of the conventional low-temperature grown buffer layer. This allows crystal growth at a high growth temperature and a high group V/group III raw material ratio, which are normally difficult to use due to anomalous growth. This avoids point defects, allowing high-concentration doping of AlGaN and the barrier layer 141 having a high Al composition.

The light emitting section 140 is formed by periodically and repetitively stacking a barrier layer 141 made of Si-doped quaternary mixed crystal AlGaInN (Al composition being 6% or more and 8% or less, and In composition being 0.3% or more and 1.0% or less), and a well layer 142 made of $In_{0.05}Ga_{0.95}N$.

The emission wavelength of the light emitting section 140 is 370 nm or more and 400 nm or less. Because the absorption edge of GaN is approximately 365 nm, the emission wavelength needs to be 370 nm or more, where absorption by GaN is not high. To avoid absorption by GaN and increase emission efficiency, the emission wavelength is preferably 380 nm or more and 385 nm or less. To form a potential deep enough to achieve highly efficient ultraviolet emission at wavelengths shorter than 385 nm despite being longer than 375 nm, the Al composition requires 6% or more, but if it exceeds 9%, the crystal quality is degraded. Slight In doping has the effect of improving crystal quality, and the effect manifests itself at an In composition of 0.3% or more. However, if the In composition exceeds 1.0%, the crystal quality is degraded, decreasing the emission efficiency.

The n-side barrier layer 141b, the inner barrier layer 141c, and the first portion 143a are highly doped with Si to increase electron concentration in the well layer 142. This shortens the radiative recombination lifetime and increases the efficiency. In this Si doping, its effect is insufficient at a concentration of $1.1 \times 10^{19}$ cm$^{-3}$ or less, and the crystal quality decreases at a concentration of $3.0 \times 10^{19}$ cm$^{-3}$ or more.

Furthermore, because Si doping also serves to cancel the piezoelectric field, a high Si concentration is required.

TABLE 1 illustrates the result of an experiment for studying the relationship between the Si concentration C3 of the barrier layer 141 and PL intensity.

More specifically, this table illustrates the result of determining the device characteristics from the relationship between radiant flux and PL intensity for various Si concentrations C3 in the barrier layer 141 (n-side barrier layer 141b, inner barrier layers 141c, and first portion 143a). In this table, the cross mark represents that the radiant flux is 10 mW or less, the triangle mark represents that the radiant flux is 10 mW or more and less than 13 mW, the circle mark represents that the radiant flux is 13 mW or more and less than 15 mW, and the double-circle mark represents that the radiant flux is 15 mW or more.

TABLE 1

| | C3 ($10^{19}$ cm$^{-3}$) | | | | | |
|---|---|---|---|---|---|---|
| | 0.69-0.83 | 0.9 | 1.1 | 1.2 | 1.2 | 1.3 |
| RESULT | X | XΔ | Δ(X) | Δ○ | Δ | Δ |
| | C3 ($10^{19}$ cm$^{-3}$) | | | | | |
| | 1.46 | 1.5 | 1.61 | 1.65 | 1.94 | 2.4 |
| RESULT | Δ○ | Δ◎ | ◎Δ | ◎ | ○ | ○ |

As shown in TABLE 1, as the Si concentration C3 increased, the PL intensity increased. The PL intensity was high at a Si concentration C3 of $1.5 \times 10^{19}$-$1.66 \times 10^{19}$ cm$^{-3}$, and decreased at $1.94 \times 10^{19}$ cm$^{-3}$ or more.

It is considered that if the Si concentration C3 is too high, the crystal quality is degraded, decreasing the efficiency. As the result of studying the relationship between Si concentration C3 and device characteristics, the radiant flux was maximized at a Si concentration C3 of $1.5 \times 10^{19}$-$1.65 \times 10^{19}$ cm$^{-3}$.

To increase the PL intensity, the Si concentration needs to be $1.1 \times 10^{19}$ cm$^{-3}$ or more. Although the PL intensity is high even at a Si concentration of $2.4 \times 10^{19}$ cm$^{-3}$, the number of pits slightly increases. Hence, in view of the lifetime of the LED device, the Si concentration is preferably $2.4 \times 10^{19}$ cm$^{-3}$ or less.

A Si-doped GaN layer having a Si concentration of $3.0 \times 10^{19}$ cm$^{-3}$ was formed. Then, its surface was slightly rough. Hence, it is considered that if the Si concentration is higher than this, the crystal quality is significantly degraded. Thus, the Si doping concentration in the barrier layer 141 (n-side barrier layer 141b, inner barrier layers 141c, and first portion 143a) is preferably $3.0 \times 10^{19}$ cm$^{-3}$ or more.

In this example, the Si concentration in the first portion 143a is equal to the Si concentration in the n-side barrier layer 141b and the inner barrier layers 141c. However, the invention is not limited thereto, but the Si concentration in the first portion 143a may be different from the Si concentration in the n-side barrier layer 141b and the inner barrier layers 141c. For instance, if the carrier concentration in the well layer 142 is sufficiently high, the Si concentration in the first portion 143a may be lower than the Si concentration in the n-side barrier layer 141b and the inner barrier layers 141c. Also in this case, the Si concentration in the first portion 143a is set higher than the Si concentration in the second portion 143b.

From these results, the Si concentration is preferably $1.1 \times 10^{19}$ cm$^{-3}$ or more and $3.0 \times 10^{19}$ cm$^{-3}$ or less.

That is, in the barrier layers (n-side barrier layer 141b and inner barrier layers 141c) except the barrier layer 141 nearest the p-type confinement layer 151, the Si concentration is preferably $1.1 \times 10^{19}$ cm$^{-3}$ or more and $3.0 \times 10^{19}$ cm$^{-3}$ or less. Furthermore, the Si concentration in the first portion 143a is preferably $1.1 \times 10^{19}$ cm$^{-3}$ or more and $3.0 \times 10^{19}$ cm$^{-3}$ or less.

In the following, the first portion 143a and the second portion 143b are described.

In the semiconductor light emitting device 10 according to this embodiment described above, the Si concentration varies stepwise, or discontinuously, between the first portion 143a and the second portion 143b. In such cases, the first portion 143a and the second portion 143b are clearly distinguished from each other.

However, the invention is not limited thereto. For instance, it is only necessary for the p-side barrier layer 141a to contain Si at a lower concentration on the p-type confinement layer 151 side than on the well layer 142 side. That is, the Si concentration may continuously decrease in the p-side barrier layer 141a from the well layer 142 side toward the p-type confinement layer 151 without clear distinction between the first portion 143a and the second portion 143b. Here, the portion with a relatively high Si concentration is regarded as the first portion 143a, and the portion with a relatively low Si concentration is regarded as the second portion 143b.

Alternatively, it is also possible to regard the first portion 143a as the p-side barrier layer 141a and regard the second portion 143b as another barrier layer provided between the p-side barrier layer 141a and the p-type confinement layer 151. However, it is assumed that the second portion 143b is included in the p-side barrier layer 141a.

With regard to the first portion 143a and the second portion 143b, in the description of the above example, the Si concentration varies discontinuously in two steps. However, the invention is not limited thereto, but the Si concentration may vary stepwise in three or more steps, or vary continuously.

Also in the case where the Si concentration varies stepwise in three or more steps, the portion with a relatively high Si concentration can be regarded as the first portion 143a, and the portion with a relatively low Si concentration can be regarded as the second portion 143b.

In the following, for simplicity of description, it is assumed that the Si concentration varies discontinuously in two steps.

The thickness of the first portion 143a may be equal to or different from the thickness of the n-side barrier layer 141b and the inner barrier layer 141c.

The thickness of the second portion 143b can be set independent of the thickness of the first portion 143a, the n-side barrier layer 141b, and the inner barrier layer 141c.

The thickness of the first portion 143a and the second portion 143b is described below.

Figure 2:
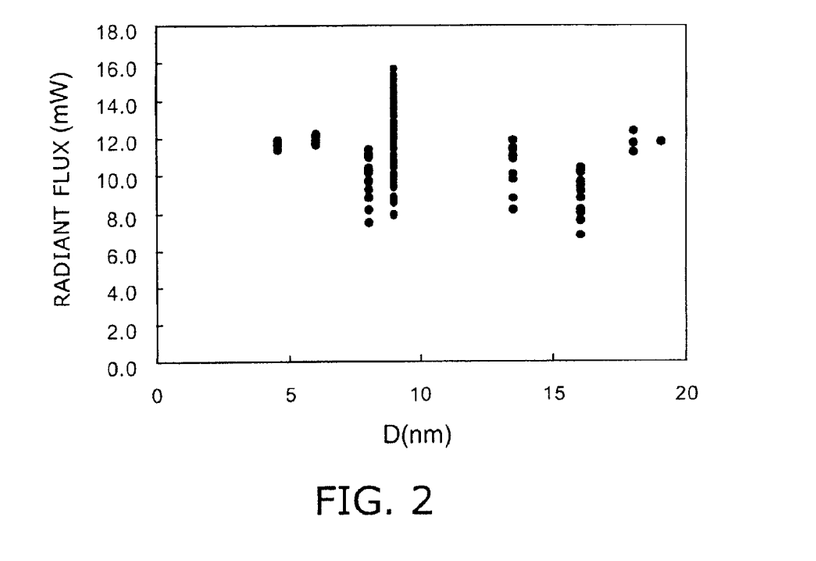
FIG. 2 is a graph illustrating the characteristics of the semiconductor light emitting device according to the first embodiment of the invention.

FIG. 2 is a graph illustrating the characteristics of the semiconductor light emitting device according to the first embodiment of the invention.

More specifically, this figure illustrates the result of an experiment for studying the emission efficiency with the thickness of the first portion 143a and the thickness of the second portion 143b each varied. The horizontal axis represents the total thickness D of the first portion 143a and the second portion 143b, and the vertical axis represents radiant flux.

As shown in FIG. 2, when the total thickness D of the first portion 143a and the second portion 143b was 9 nm, the radiant flux was maximized. When the total thickness D exceeded 9 nm, the emission efficiency decreased. This is presumably because holes are trapped by the interface between the second portion 143b and the p-type confinement layer 151, increasing non-radiative recombination. In the case where the total thickness D is smaller than 4 nm, diffusion of Mg cannot be prevented.

In this experiment, the thickness of the inner barrier layer 141c of the light emitting section 140 is 13.5 nm. Hence, the total thickness D of the first portion 143a and the second portion 143b is preferably smaller than the thickness of the inner barrier layer 141c of the light emitting section 140.

Furthermore, in view of device reproducibility and productivity, the total thickness D of the first portion 143a and the second portion 143b is preferably 7 nm or more and 12 nm or less.

Next, the thickness tb of the second portion 143b is described.

TABLE 2 illustrates the result of an experiment for studying the relationship between the thickness tb of the second portion 143b and device characteristics. More specifically, this table illustrates the relationship between the thickness tb of the second portion 143b and average radiant flux. In this table, the cross mark represents that the radiant flux is 10 mW or less, the triangle mark represents that the radiant flux is 10 mW or more and less than 13 mW, the circle mark represents that the radiant flux is 13 mW or more and less than 15 mW, and the double-circle mark represents that the radiant flux is 15 mW or more.

TABLE 2

|  | tb(nm) | | |
| --- | --- | --- | --- |
|  | 0 | 4.5 | 9 |
| RESULT | X | ○◎ | Δ |

As shown in TABLE 2, the radiant flux was maximized when the thickness tb of the second portion 143b was 4.5 nm, and decreased when it was 9 nm. In the case where the thickness tb of the second portion 143b was 0 nm, that is, in the case of a comparative example including no second portion 143b, the radiant flux was low.

Furthermore, although not described in this table, the PL intensity significantly decreased when the thickness tb was 10 nm or more.

Hence, the thickness tb of the second portion 143b is preferably 3 nm or more and 9 nm or less.

Furthermore, the reproducibility and productivity of device characteristics are superior when the thickness tb of the second portion 143b is 3 nm or more and 6 nm or less.

In the semiconductor light emitting device 10 according to the first embodiment, the thickness tb of the second portion 143b is 4.5 nm, and the thickness of the first portion 143a is also 4.5 nm. In this case, the total thickness D of the first portion 143a and the second portion 143b is 9 nm, which corresponds to the condition for maximizing the radiant flux described with reference to FIG. 2.

Next, the Si concentration of the second portion 143b is described.

Figure 3:
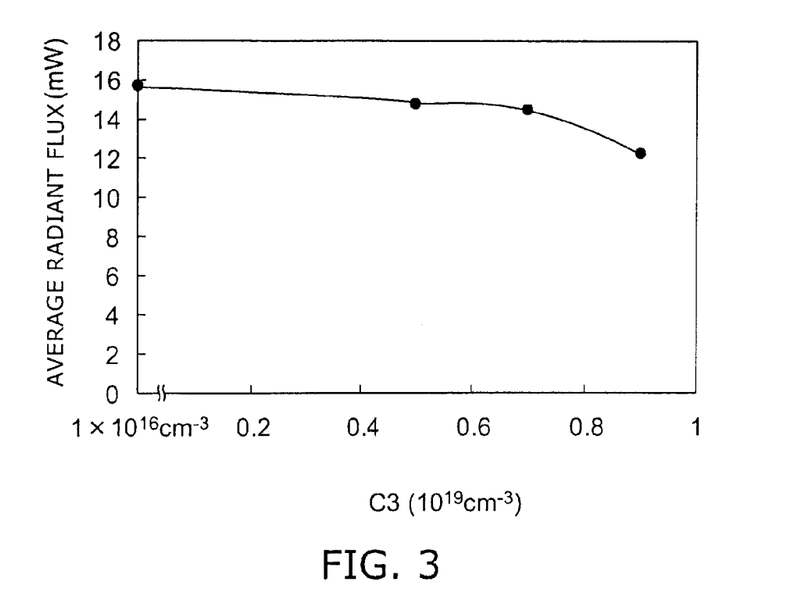
FIG. 3 is a graph illustrating the characteristics of the semiconductor light emitting device according to the first embodiment of the invention.

FIG. 3 is a graph illustrating the characteristics of the semiconductor light emitting device according to the first embodiment of the invention.

More specifically, this figure illustrates the result of an experiment for studying the relationship between the Si concentration of the second portion 143b and emission efficiency. The horizontal axis represents the Si concentration C3 of the second portion 143b, and the vertical axis represents average radiant flux.

As shown in FIG. 3, in the semiconductor light emitting device 10 according to this embodiment, the average radiant flux was increased with the decrease of the Si concentration C3 of the second portion 143b, and maximized in the non-doped case (a Si concentration of approximately $1 \times 10^{16}$ cm$^{-3}$). This value of Si concentration, $1 \times 10^{16}$ cm$^{-3}$, is the concentration of Si contained even in the case without intentional doping, that is, the concentration at the background level.

From FIG. 3, the Si concentration C3 of the second portion 143b can be set to $1 \times 10^{16}$ cm$^{-3}$ or more and $9.0 \times 10^{18}$ cm$^{-3}$ or less. The reproducibility and productivity of device characteristics are superior when the Si concentration C3 of the second portion 143b falls within this range.

In the following, the Mg concentration of the p-type confinement layer 151 is described.

In the semiconductor light emitting device 10 according to this embodiment, the crystal quality of the light emitting section 140 is improved by the barrier layer 141 made of quaternary mixed crystal AlGaInN. Hence, the p-type confinement layer 151 can be doped with Mg at a higher concentration than conventional.

TABLE 3 illustrates the result of an experiment for studying the relationship between the average Mg concentration C4 of the p-type confinement layer 151 and device characteristics. More specifically, this table illustrates the result of determining the device characteristics from the relationship between radiant flux and PL intensity with respect to the average Mg concentration C4 of the p-type confinement layer 151. In this table, the cross mark represents that the radiant flux is 10 mW or less, the triangle mark represents that the radiant flux is 10 mW or more and less than 13 mW, the circle mark represents that the radiant flux is 13 mW or more and less than 15 mW, and the double-circle mark represents that the radiant flux is 15 mW or more.

TABLE 3

| | C4 ($10^{19}$ cm$^{-3}$) | | | | |
| --- | --- | --- | --- | --- | --- |
| | 0.7 | 0.9 | 1 | 1.1 | 1.15 |
| RESULT | X | XΔ | ○ | ○ | ○◎ |

| | C4 ($10^{19}$ cm$^{-3}$) | | | | |
| --- | --- | --- | --- | --- | --- |
| | 1.21 | 1.3 | 1.6 | 1.75 | 1.94 |
| RESULT | Δ | XΔ | XΔ | X | X |

As shown in TABLE 3, the radiant flux was increased with the increase of the average Mg concentration C4 of the p-type confinement layer 151, and maximized when the average Mg concentration C4 was $1.15 \times 10^{19}$ cm$^{-3}$. The radiant flux was decreased when the average Mg concentration C4 was further increased.

From TABLE 3, the average Mg concentration C4 of the p-type confinement layer 151 is preferably $0.9 \times 10^{19}$-$1.6 \times 10^{19}$ cm$^{-3}$.

However, this is the value of the average Mg concentration C4. In practice, the p-type confinement layer 151 has a distributed Mg concentration.

That is, the Mg concentration of the p-type confinement layer 151 is high, $2 \times 10^{19}$ cm$^{-3}$, on the second portion 143b side, and low, $8 \times 10^{18}$ cm$^{-3}$, on the surface side (opposite side from the second portion 143b). A good result was achieved in this case.

Thus, the Mg concentration of the p-type confinement layer 151 can be set to $8 \times 10^{18}$-$2 \times 10^{19}$ cm$^{-3}$. Furthermore, the average Mg concentration C4 in the p-type confinement layer 151 can also be set to $2 \times 10^{19}$ cm$^{-3}$.

The p-type contact layer 150 also has a distributed Mg concentration. The efficiency was increased when the Mg concentration of the p-type contact layer 150 was lower on the p-type confinement layer 151 side than on the surface side (opposite side from the p-type confinement layer 151).

That is, the Mg concentration of the p-type contact layer 150 is low on the light emitting section 140 side and high on the surface side (opposite side from the light emitting section 140). This can cancel the piezoelectric field in the p-type confinement layer 151 hampering hole injection, and improve the carrier confinement effect in conjunction with reducing the operating voltage.

More specifically, the efficiency was increased when the Mg concentration on the p-type confinement layer 151 side of the p-type contact layer 150 was $1 \times 10^{19}$ cm$^{-3}$ and the Mg concentration on the surface side (opposite side from the p-type confinement layer) was $5$-$9 \times 10^{19}$ cm$^{-3}$.

When the Mg concentration near the surface of the p-type contact layer 150 is $1 \times 10^{20}$ cm$^{-3}$ or more, diffusion into the light emitting section 140 occurs, degrading the efficiency and reliability. At $5 \times 10^{19}$ cm$^{-3}$ or less, the operating voltage increases.

The p-type confinement layer 151 is preferably made of $Al_xGa_{1-x}N$ ($0.2 \leq x \leq 0.32$). That is, devices with x being 0.2-0.32 in the above composition formula exhibited good characteristics, whereas the efficiency was low for devices fabricated with x being 0.35. Hence, the p-type confinement layer 151 is preferably made of $Al_xGa_{1-x}N$ ($0.2 \leq x \leq 0.32$).

Second Embodiment

Figure 4:
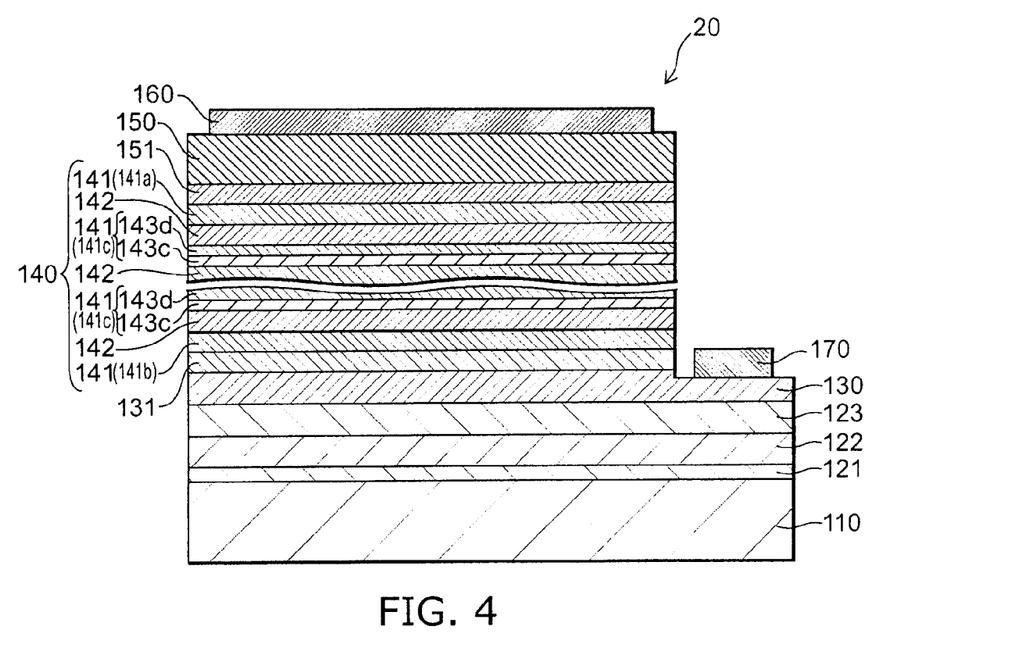
FIG. 4 is a schematic cross-sectional view illustrating the configuration of a semiconductor light emitting device according to a second embodiment of the invention.

FIG. 4 is a schematic cross-sectional view illustrating the configuration of a semiconductor light emitting device according to a second embodiment of the invention.

As shown in FIG. 4, the semiconductor light emitting device 20 according to the second embodiment of the invention has a structure formed by stacking, on a substrate 110 having a sapphire c-plane surface, a first buffer layer 121 made of highly carbon-doped AlN, a second buffer layer 122 made of high-purity AlN, a lattice-relaxed layer 123 made of non-doped GaN, an n-type contact layer 130 made of Si-doped n-type GaN, an n-type confinement layer 131 made of Si-doped n-type AlGaN, a light emitting section 140, a p-type confinement layer 151 made of Mg-doped p-type AlGaN, and a p-type contact layer 150 made of Mg-doped p-type GaN.

The first buffer layer 121, the second buffer layer 122, the lattice-relaxed layer 123, the n-type contact layer 130, the n-type confinement layer 131, the p-type confinement layer 151, and the p-type contact layer 150 can be based on the same material and configuration as those described in the first embodiment.

In the semiconductor light emitting device 20 according to this embodiment, the light emitting section 140 has a multiple quantum well structure in which a barrier layer 141 made of Si-doped n-type AlGaInN and a well layer 142 made of GaInN are alternately stacked six times.

Here, the aforementioned AlGaInN is $Al_xGa_{1-x-y}In_yN$ ($0 \leq x$, $0 \leq y$, $x+y \leq 1$).

The well layer 142 can be made of not only GaInN but also AlGaInN.

Furthermore, in the light emitting section 140 of the semiconductor light emitting device 20 according to this embodiment, the barrier layer 141 sandwiched between the well layers 142, that is, the inner barrier layer 141c, has a distributed Si concentration. That is, the inner barrier layer 141c has a stacked structure including a third portion 143c with low Si concentration and a fourth portion 143d with high Si concentration.

More specifically, in the light emitting section 140, each barrier layer 141 sandwiched between the well layers 142, that is, each inner barrier layer 141c, includes a layered third portion 143c provided on the n-type confinement layer (first layer) 131 side and made of Si-containing $Al_xGa_{1-x-y}In_yN$ ($0 \leq x$, $0 \leq y$, $x+y \leq 1$), and a layered fourth portion 143d provided on the p-type confinement layer (second layer) 151 side and made of $Al_xGa_{1-x-y}In_yN$ ($0 \leq x$, $0 \leq y$, $x+y \leq 1$) which contains Si at a concentration higher than the Si concentration in the third portion 143c.

The third portion 143c with low Si concentration can be illustratively made of $Al_{0.08}Ga_{0.9}In_{0.02}N$ with, for instance, a Si concentration of $1 \times 10^{16}$ cm$^{-3}$ and a thickness of 4.5 nm.

The fourth portion 143d with high Si concentration can be illustratively made of $Al_{0.08}Ga_{0.9}In_{0.02}N$ with, for instance, a Si concentration of $2 \times 10^{19}$ cm$^{-3}$ and a thickness of 9 nm.

However, the Si concentration in the third portion 143c only needs to be relatively lower than the Si concentration in the fourth portion 143d. That is, each inner barrier layer 141c only needs to have a Si concentration distribution which decreases from the p-type confinement layer 151 side to the n-type confinement layer 131 side.

Here, the Si concentration in the p-side barrier layer 141a can be set lower than the Si concentration in the n-side barrier layer 141b.

For instance, the p-side barrier layer 141a can be made of $Al_{0.08}Ga_{0.9}In_{0.02}N$ with low Si concentration with, for instance, a Si concentration of $1 \times 10^{16}$ cm$^{-3}$ and a thickness of 9 nm. The Si concentration in the p-side barrier layer 141a may be comparable to or different from the Si concentration in the third portion 143c. The thickness may also be equal or different. Furthermore, the n-side barrier layer 141b can be made of $Al_{0.08}Ga_{0.9}In_{0.02}N$ with, for instance, a Si concentration of $2 \times 10^{19}$ cm$^{-3}$ and a thickness of 9 nm.

The well layer 142 of the light emitting section 140 can be illustratively made of GaInN with a thickness of 4.5 nm, and the peak wavelength of light emitted from the light emitting section 140 can be in the near-ultraviolet region, 370-400 nm.

Each third portion 143c with low Si concentration is located nearer the n-type confinement layer 131 than each fourth portion 143d with high Si concentration.

Four well layers 142 are provided, and the third portion 143c with low Si concentration and the fourth portion 143d with high Si concentration are sandwiched between the well layers 142. That is, the third portion 143c and the highly Si-doped fourth portion 143d constituting the inner barrier layer 141c are provided between each pair of the four well layers 142.

Thus, in the semiconductor light emitting device 20 according to this embodiment, the inner barrier layer 141c is formed from the combination of the third portion 143c with low Si concentration and the fourth portion 143d with high Si concentration.

In this example, the third portion 143c with low Si concentration is implemented by a non-doped layer so that the Si concentration distribution is changed between the third portion 143c with low Si concentration and the fourth portion 143d with high Si concentration. This concentration distribution is not limited to the concentration difference in two steps, but the concentration may be varied continuously and gradually. The variation may be linear or nonlinear.

Next, a description is given of the relationship between the Si concentration distribution in the barrier layer 141 configured as described above and the piezoelectric field applied to the well layer 142.

A piezoelectric field is applied to the well layer 142. Hence, at the interface between the well layer 142 and the barrier layer 141 in contact therewith on the p-type confinement layer 151 side, positive charges penetrate from the well layer 142 to the barrier layer 141. On the other hand, at the interface between the well layer 142 and the barrier layer 141 in contact therewith on the n-type confinement layer 131 side, negative charges penetrate from the well layer 142 to the barrier layer 141.

Because many electrons exist on the p-type confinement layer 151 side of the well layer 142, there is no need to supply electrons from the barrier layer 141. Hence, the barrier layer 141 in contact with this interface can be at a low Si concentration. Thus, a third portion 143c with low Si concentration is located in the barrier layer 141 so as to be in contact with the well layer 142 on the p-type confinement layer 151 side.

On the other hand, because few electrons exist on the n-type confinement layer 131 side of the well layer 142, it is necessary to supply electrons from the barrier layer 141. Hence, the barrier layer 141 in contact with this interface needs to have a high Si concentration. Thus, a fourth portion 143d with high Si concentration is located in the barrier layer so as to be in contact with the well layer 142 on the n-type confinement layer 131 side.

That is, the third portion 143c with low Si concentration is located on the p-type confinement layer 151 side of the well layer 142, and the fourth portion 143d with high Si concentration is located on the n-type confinement layer 131 side of the well layer 142. In other words, in each inner barrier layer 141c sandwiched between the well layers 142, the Si concentration decreases from the p-type confinement layer 151 side to the n-type confinement layer 131 side.

By varying the Si concentration in the inner barrier layer 141c as described above, the emission efficiency can be increased. In addition, the half-width of the emission spectrum can be narrowed.

More specifically, at the interface between the well layer 142 and the fourth portion 143d in contact therewith on the n-type confinement layer 131 side, a large quantity of electrons flow from the fourth portion 143d with high Si concentration into the well layer 142, leaving a large quantity of positively charged Si in the fourth portion 143d. The distribution of electron concentration and Si concentration at this interface serves to cancel the piezoelectric field, and consequently the piezoelectric field is weakened. As the piezoelectric field is weakened, the energy band of MQW warped by the piezoelectric field is flattened, and accordingly the emission efficiency is increased. Furthermore, the half-width of the emission spectrum is narrowed.

As described above, in the semiconductor light emitting device 20 according to this embodiment, the Si concentration is varied inside the inner barrier layer 141c to control the electric field applied to the light emitting section 140, thereby increasing the emission efficiency. Thus, this embodiment can provide a semiconductor light emitting device achieving near-ultraviolet emission with high efficiency.

Furthermore, in the semiconductor light emitting device 20 according to this embodiment, the Si concentration in the p-side barrier layer 141a can be set lower than the Si concentration in the n-side barrier layer 141b to improve reliability and reduce the driving voltage of the semiconductor light emitting device 20.

That is, the decreased Si concentration in the p-side barrier layer 141a reduces electrons which overflow from the well layer 142 nearest the p-type confinement layer 151 to the p-type confinement layer 151 side. Thus, the reliability of the semiconductor light emitting device is improved.

Furthermore, the decreased Si concentration in the p-side barrier layer 141a lowers the energy level of the p-side barrier layer 141a and tends to exclude holes, which is effective in voltage reduction of the semiconductor light emitting device 20.

As described above, in the semiconductor light emitting device 20 according to this embodiment, the decreased Si concentration in the p-side barrier layer 141a serves to increase the emission efficiency. Thus, this embodiment can provide a semiconductor light emitting device achieving near-ultraviolet emission with high efficiency, high reliability, and low driving voltage.

In the above example, the Si concentration in the p-side barrier layer 141a is uniform. However, like the semiconductor light emitting device 10 according to the first embodiment, the p-side barrier layer 141a can include a first portion 143a with high Si concentration and a second portion 143b with low Si concentration. In this case, the distribution of Si concentration can be varied stepwise or continuously as long as the Si concentration in the p-side barrier layer 141a is set lower than in the n-side barrier layer 141b. Furthermore, the Si concentration in the p-side barrier layer 141a can be set lower than the Si concentration in the inner barrier layer 141c, that is, the Si concentration in the combination of the third portion 143c and the fourth portion 143d.

Next, a technique for growing the barrier layer 141 is described. A quaternary mixed crystal AlGaInN layer having good crystal quality is difficult to grow. Furthermore, the crystal is prone to degradation when highly doped with Si. By studying the LED device structure and optimizing the growth condition, we have succeeded in increasing the In composition ratio of the barrier layer 141 made of AlGaInN without degradation in crystal quality.

For instance, in the semiconductor light emitting device 10 according to the first embodiment, the barrier layer 141 has a large thickness, and hence the In composition has a limit of approximately 1%. However, in the structure of the semiconductor light emitting device 20 according to this embodiment, the thickness of the barrier layer (fourth portion 143d) highly doped with Si in the inner barrier layer 141c can be decreased. Hence, the crystal is not degraded even if it contains 2% In, and intense light emission is achieved.

A high In composition ratio improves the steepness of the interface with the well layer 142 made of GaInN, enhances the crystallinity of MQW, and consequently allows the fourth portion 143d made of AlGaInN to be highly doped with Si.

Furthermore, the decreased thickness of the fourth portion 143d with high Si concentration allows Si doping at a higher concentration.

In the semiconductor light emitting device 20 according to this embodiment, forming a fourth portion 143d with very high Si concentration is important, and serves to significantly increase the emission efficiency.

Third Embodiment

Figure 5:
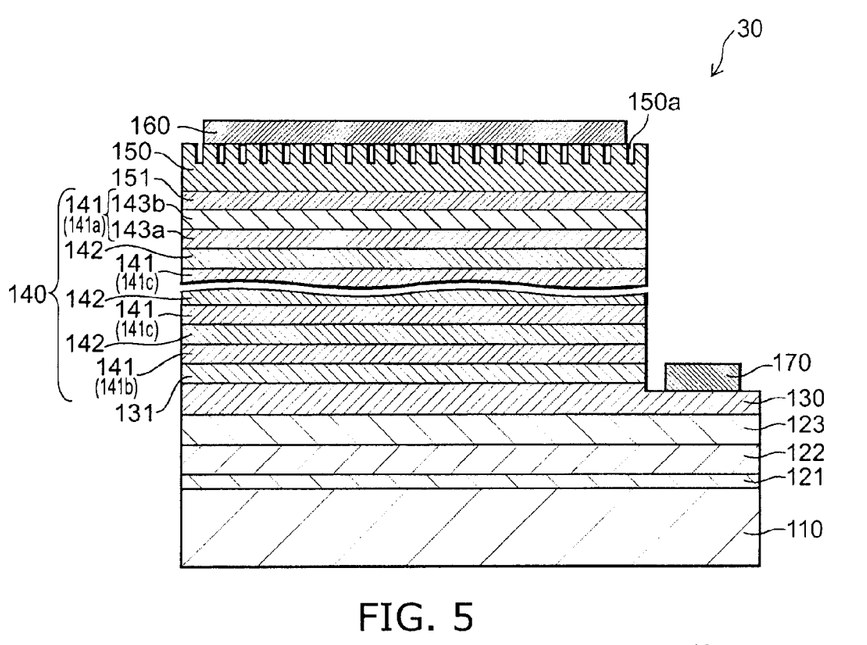
FIG. 5 is a schematic cross-sectional view illustrating the configuration of a semiconductor light emitting device according to a third embodiment of the invention.

FIG. 5 is a schematic cross-sectional view illustrating the configuration of a semiconductor light emitting device according to a third embodiment of the invention.

As shown in FIG. 5, in the semiconductor light emitting device 30 according to the third embodiment of the invention, a projections and depressions 150a is provided at the interface of the p-type contact layer 150 with the p-side electrode 160. The rest is the same as the semiconductor light emitting device 10 according to the first embodiment, and hence the description thereof is omitted.

The projections and depressions 150a improves contact between the p-type contact layer 150 and the p-side electrode 160, and also has the effect of diffusing emitted light and radiating it outside.

In the semiconductor light emitting device 30 having such structure, this embodiment can provide a semiconductor light emitting device achieving near-ultraviolet emission with higher efficiency.

The aforementioned projections and depressions 150a can be provided in the second semiconductor light emitting device 20. More specifically, the inner barrier layer 141c of the light emitting section 140 can be a combined barrier of a third portion 143c with low Si concentration and a fourth portion 143d with high Si concentration. Here, furthermore, as described in the first embodiment, the p-side barrier layer 141a can include a first portion 143a with high Si concentration and a second portion 143b with low Si concentration. Also in these cases, a similar effect of the projections and depressions 150a is achieved.

Fourth Embodiment

Figure 6:
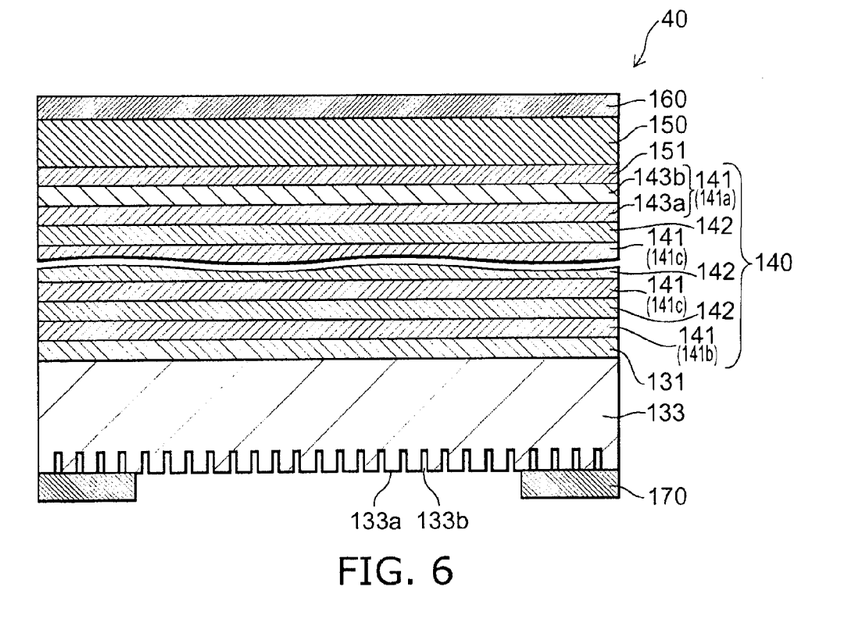
FIG. 6 is a schematic cross-sectional view illustrating the configuration of a semiconductor light emitting device according to a fourth embodiment of the invention.

FIG. 6 is a schematic cross-sectional view illustrating the configuration of a semiconductor light emitting device according to a fourth embodiment of the invention.

As shown in FIG. 6, in the semiconductor light emitting device 40 according to the fourth embodiment of the invention, on an n-type GaN wafer 133, the n-type confinement layer 131, the light emitting section 140, the p-type confinement layer 151, and the p-type contact layer 150 described in the first embodiment are sequentially provided. A p-side electrode 160 is provided on the p-type contact layer 150. Furthermore, projections and depressions 133b are provided at the backside 133a of the n-type GaN wafer 133, and an n-side electrode 170 is provided in contact with the projections and depressions 133b at the backside 133a of the n-type GaN wafer 133. The rest is the same as the semiconductor light emitting device 10 according to the first embodiment, and hence the description thereof is omitted.

The semiconductor light emitting device 40 according to this embodiment does not use the substrate 110 made of sapphire described in the first embodiment, but uses an n-type GaN wafer 133 having crystal quality with low dislocation density.

In the semiconductor light emitting device 40 according to this embodiment, use of the n-type GaN wafer 133 allows a current to flow in the thickness direction of the n-type GaN wafer 133, which has the effect of decreasing the operating voltage.

In the semiconductor light emitting device 40 having such structure, like the first embodiment, this embodiment can also provide a semiconductor light emitting device achieving near-ultraviolet emission with high efficiency and low operating voltage.

The n-type GaN wafer 133 described in this embodiment is also applicable to the semiconductor light emitting device 20 according to the second embodiment. More specifically, the inner barrier layer 141c of the light emitting section 140 can be a combined barrier of a third portion 143c with low Si concentration and a fourth portion 143d with high Si concentration. Here, furthermore, as described in the first embodiment, the p-side barrier layer 141a can include a first portion 143a with high Si concentration and a second portion 143b with low Si concentration. Also in these cases, a similar effect of the n-type GaN wafer 133 is achieved.

Fifth Embodiment

Figure 7:
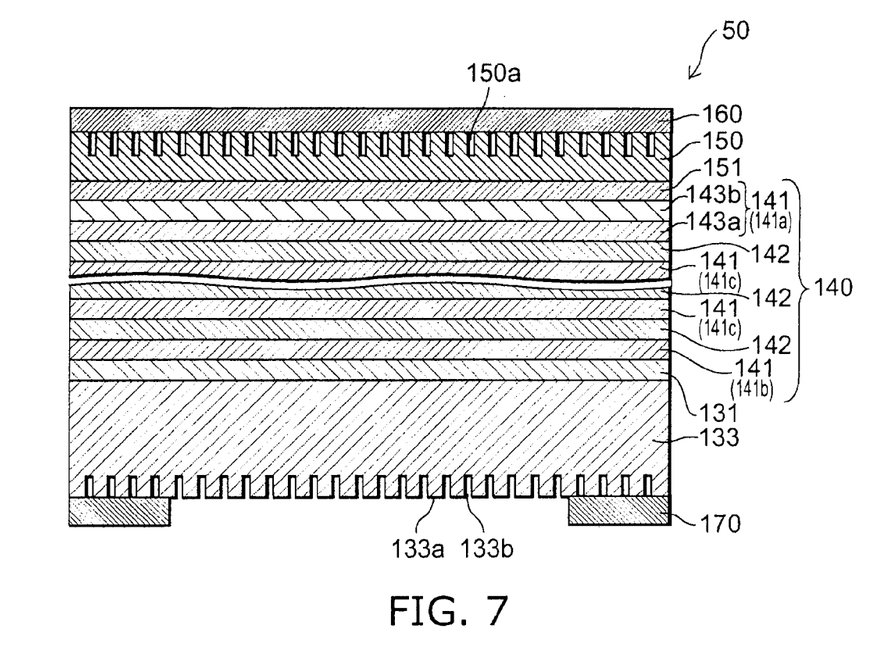
FIG. 7 is a schematic cross-sectional view illustrating the configuration of a semiconductor light emitting device according to a fifth embodiment of the invention.

FIG. 7 is a schematic cross-sectional view illustrating the configuration of a semiconductor light emitting device according to a fifth embodiment of the invention.

As shown in FIG. 7, in the semiconductor light emitting device 50 according to the fifth embodiment of the invention, on an n-type GaN wafer 133, the n-type confinement layer 131, the light emitting section 140, the p-type confinement layer 151, and the p-type contact layer 150 described in the first embodiment are sequentially provided. P projections and depressions 150a are provided at the upper surface of the p-type contact layer 150, and a p-side electrode 160 is provided thereon. Furthermore, projections and depressions 133b are provided at the backside 133a of the n-type GaN wafer 133, and an n-side electrode 170 is provided in contact with the projections and depressions 133b at the backside 133a of the n-type GaN wafer 133. The rest is the same as the semiconductor light emitting device 10 according to the first embodiment, and hence the description thereof is omitted.

The semiconductor light emitting device 50 according to this embodiment does not use the substrate 110 made of sapphire described in the first embodiment, but uses an n-type GaN wafer 133 having crystal quality with low dislocation density.

In the semiconductor light emitting device 50 according to this embodiment, use of the n-type GaN wafer 133 allows a current to flow in the thickness direction of the n-type GaN wafer 133, which has the effect of decreasing the operating voltage.

In the semiconductor light emitting device 50 having such structure, like the first embodiment, this embodiment can also provide a semiconductor light emitting device achieving near-ultraviolet emission with high efficiency and low operating voltage.

Furthermore, the efficiency can be further increased by providing projections and depressions 133b at the backside of the n-type GaN wafer 133 in conjunction with providing projections and depressions 150a in the p-type contact layer 150.

The n-type GaN wafer 133 and the projections and depressions 150a described in this embodiment are also applicable to the semiconductor light emitting device 20 according to the second embodiment.

Sixth Embodiment

Figure 8:
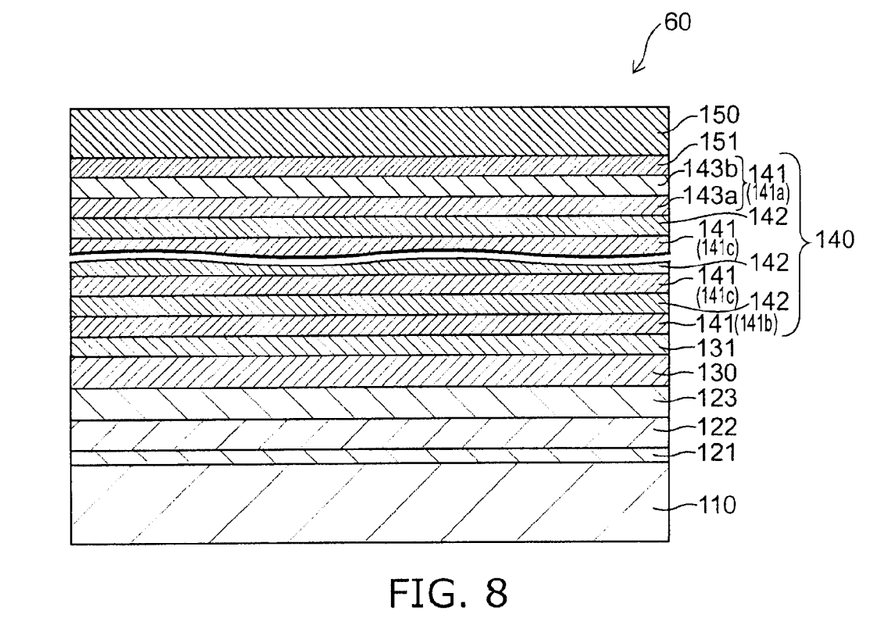
FIG. 8 is a schematic cross-sectional view illustrating the configuration of a wafer according to a sixth embodiment of the invention.

FIG. 8 is a schematic cross-sectional view illustrating the configuration of a wafer according to a sixth embodiment of the invention.

As shown in FIG. 8, the wafer 60 according to the sixth embodiment of the invention comprises: a first layer 131 made of at least one of n-type GaN and n-type AlGaN; a second layer made of Mg-containing p-type AlGaN; and a light emitting section 140 provided between the first layer 131 and the second layer 151 and including a plurality of barrier layers 141 made of Si-containing $Al_xGa_{1-x-y}In_yN$ ($0 \leq x$, $0 \leq y$, $x+y \leq 1$), and a well layer 142 provided between each pair of the plurality of barrier layers 141 and made of GaInN or AlGaInN, one of the barrier layers 141 nearest the second layer including a first portion 143a made of Si-containing $Al_xGa_{1-x-y}In_yN$ ($0 \leq x$, $0 \leq y$, $x+y \leq 1$), and a second portion 143b provided between the first portion 143a and the second layer 151 and made of $Al_xGa_{1-x-y}In_yN$ ($0 \leq x$, $0 \leq y$, $x+y \leq 1$) which contains Si at a concentration lower than Si concentration in the first portion 143a and lower than Si concentration in the barrier layers except the one barrier layer nearest the second layer 151. That is, the plurality of barrier layers 141 have a nearest barrier layer and a far barrier layer. The nearest barrier layer is nearest to the second layer among the plurality of barrier layers. The nearest barrier layer has the first portion 143a and the second portion 143b.

In the wafer 60 having such structure, this embodiment can provide a wafer achieving near-ultraviolet emission with high efficiency like the first embodiment.

As described with reference to the first embodiment, in the wafer 60, the Si concentration in the first portion 143a can be not more than the Si concentration in the barrier layers 141 (n-side barrier layer 141b and inner barrier layers 141c) except the barrier layer 141 nearest the second layer 151. The first portion 143a is in contact with the well layer 142.

The thickness of the second portion 143b is preferably 3 nm or more and 9 nm or less.

The Si concentration in the second portion 143b is preferably $1 \times 10^{16}$ cm$^{-3}$ or more and $9.0 \times 10^{18}$ cm$^{-3}$ or less.

The Si concentration in the barrier layers 141 (n-side barrier layer 141b and inner barrier layers 141c) except the barrier layer 141 nearest the second layer 151 is preferably $1.1 \times 10^{19}$ cm$^{-3}$ or more and $3 \times 10^{19}$ cm$^{-3}$ or less.

The Si concentration in the first portion 143a is preferably $1.1 \times 10^{19}$ cm$^{-3}$ or more and $3 \times 10^{19}$ cm$^{-3}$ or less.

Seventh Embodiment

Figure 9:
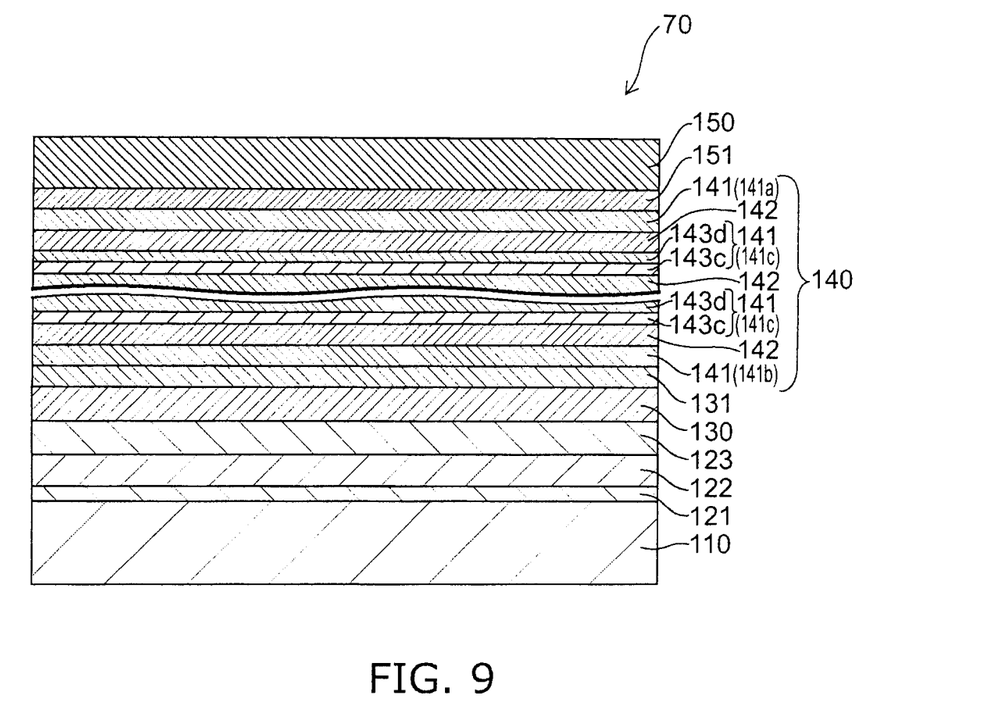
FIG. 9 is a schematic cross-sectional view illustrating the configuration of a wafer according to a seventh embodiment of the invention.

FIG. 9 is a schematic cross-sectional view illustrating the configuration of a wafer according to a seventh embodiment of the invention.

As shown in FIG. 9, the wafer 70 according to the seventh embodiment of the invention comprises: a first layer 131 made of at least one of n-type GaN and n-type AlGaN; a second layer 151 made of Mg-containing p-type AlGaN; and a light emitting section 140 provided between the first layer 131 and the second layer 151 and including a plurality of barrier layers 141 made of Si-containing $Al_xGa_{1-x-y}In_yN$ ($0 \leq x$, $0 \leq y$, $x+y \leq 1$), and a well layer 142 provided between each pair of the plurality of barrier layers 141 and made of GaInN or AlGaInN, each of the barrier layers 141 sandwiched between the well layers 142 including a third portion 143c provided on the first layer 131 side and made of Si-containing $Al_xGa_{1-x-y}In_yN$ ($0 \leq x$, $0 \leq y$, $x+y \leq 1$), and a fourth portion 143d provided on the second layer 151 side and made of $Al_xGa_{1-x-y}In_yN$ ($0 \leq x$, $0 \leq y$, $x+y \leq 1$) which contains Si at a concentration higher than Si concentration in the third portion 143c.

In the wafer 70 having such structure, this embodiment can provide a wafer achieving near-ultraviolet emission with high efficiency like the second embodiment.

As described with reference to the second embodiment, in the wafer 70, the Si concentration in the barrier layer 141 (p-side barrier layer 141a) nearest the second layer 151 can be set lower than the Si concentration in the barrier layer 141 (n-side barrier layer 141b) nearest the first layer 131.

The barrier layer 141 (p-side barrier layer 141a) nearest the second layer 151 can include a first portion 143a made of Si-containing $Al_xGa_{1-x-y}In_yN$ ($0 \leq x$, $0 \leq y$, $x+y \leq 1$), and a second portion 143b provided between the first portion 143a and the second layer 151 and made of $Al_xGa_{1-x-y}In_yN$ ($0 \leq x$, $0 \leq y$, $x+y \leq 1$) which contains Si at a concentration lower than Si concentration in the first portion 143a.

The Si concentration in the fourth portion 143d is preferably $1.1 \times 10^{19}$ cm$^{-3}$ or more and $3 \times 10^{19}$ cm$^{-3}$ or less.

The Si concentration in the barrier layer 141 (n-side barrier layer 141b) nearest the first layer 131 is preferably $1.1 \times 10^{19}$ cm$^{-3}$ or more and $3 \times 10^{19}$ cm$^{-3}$ or less.

As described with reference to the first and second embodiment, in the wafer 60 and the wafer 70, the second layer 151 can be made of $Al_xGa_{1-x}N$ ($0.2 \leq x \leq 0.32$).

The Mg concentration on the light emitting section 140 side of the second layer 151 can be set higher than the Mg concentration on the opposite side of the second layer 151 from the light emitting section 140.

The Mg concentration of the second layer 151 can be set to $8 \times 10^{18}$ cm$^{-3}$ or more and $3 \times 10^{19}$ cm$^{-3}$ or less.

The wafer 60 and the wafer 70 can further comprise a third layer (p-type contact layer) 150 provided on the opposite side of the second layer 151 from the light emitting section 140 and made of at least one of p-type GaN and p-type AlGaN, wherein the Mg concentration on the first layer 131 side of the third layer 150 can be set lower than the Mg concentration on the opposite side of the third layer 150 from the first layer 131.

In the wafer 60 and the wafer 70, the peak wavelength of light emitted from the light emitting section 140 can be set in the range of 370-400 nm.

The light emitting section 140 can be provided on a GaN layer grown above a substrate 110 having a sapphire c-plane via a single crystal buffer layer having a composition range of $Al_xGa_{1-x}N$ ($0.8 \leq x \leq 1$).

The single crystal buffer layer can include a second buffer layer 122 provided above the substrate 110, and a first buffer layer provided between the second buffer layer 122 and the substrate 110, having a higher carbon concentration than the second buffer layer 122, and having a thickness of 3 nm or more and 20 nm or less.

The wafer 60 and the wafer 70 according to the embodiments of the invention can be provided with the projections and depressions 150a, 133b described in the third, fourth, and fifth embodiment.

The embodiments of the invention have been described with reference to examples. However, the invention is not limited to these examples. For instance, various specific configurations of the components constituting the semiconductor light emitting device and the wafer are encompassed within the scope of the invention as long as those skilled in the art can similarly practice the invention and achieve similar effects by suitably selecting such configurations from conventionally known ones.

Furthermore, any two or more components of the examples can be combined with each other as long as technically feasible, and such combinations are also encompassed within the scope of the invention as long as they fall within the spirit of the invention.

Furthermore, those skilled in the art can suitably modify and implement the semiconductor light emitting device and the wafer described above in the embodiments of the invention, and any semiconductor light emitting device and wafer thus modified are also encompassed within the scope of the invention as long as they fall within the spirit of the invention.

Furthermore, those skilled in the art can conceive various modifications and variations within the spirit of the invention, and it is understood that such modifications and variations are also encompassed within the scope of the invention.

The invention claimed is:

1. A semiconductor light emitting device comprising:
   a first layer made of at least one of n-type GaN and n-type AlGaN;
   a second layer made of Mg-containing p-type AlGaN, a Mg concentration in the second layer being $8 \times 10^{18}$ cm$^{-3}$ or more and $3 \times 10^{19}$ cm$^{-3}$ or less; and
   a light emitting section provided between the first layer and the second layer,
   the light emitting section including
      a plurality of barrier layers made of Si-containing $Al_xGa_{1-x-y}In_yN$ ($0 \leq x$, $0 \leq y$, $x+y \leq 1$), x being 0.06 or more and 0.08 or less, y being 0.003 or more and 0.01 or less, and
      a well layer provided between each pair of the plurality of barrier layers and made of GaInN or AlGaInN,
   the plurality of barrier layers having
      a nearest barrier layer nearest to the second layer among the plurality of barrier layers, and
      a far barrier layer, a Si concentration in the far barrier layer being $1.1 \times 10^{19}$ cm$^{-3}$ or more and $3 \times 10^{19}$ cm$^{-3}$ or less,
   wherein only the nearest barrier layer includes
      a first portion made of Si-containing $Al_xGa_{1-x-y}In_yN$ ($0 \leq x$, $0 \leq y$, $x+y \leq 1$), the first portion being in contact with the well layer, a Si concentration in the first portion being $1.1 \times 10^{19}$ cm$^{-3}$ or more and $3 \times 10^{19}$ cm$^{-3}$ or less and
      a second portion provided between the first portion and the second layer and made of $Al_xGa_{1-x-y}In_yN$ ($0 \leq x$, $0 \leq y$, $x+y \leq 1$), a Si concentration in the second portion being $1 \times 10^{16}$ cm$^{-3}$ or more and $9.0 \times 10^{18}$ cm$^{-3}$ or less, the second portion having a thickness of 3 nanometers or more and 9 nanometers or less, the Si concentration in the second portion being lower than the Si concentration in the first portion and lower than the Si concentration in the far barrier layer, and
   a Mg concentration on the light emitting section side of the second layer being higher than a Mg concentration on the opposite side of the second layer from the light emitting section.

2. The device according to claim 1, wherein the second layer is made of $Al_xGa_{1-x}N$ ($0.2 \leq x \leq 0.32$).

3. The device according to claim 1, further comprising a third layer provided on the opposite side of the second layer from the light emitting section and made of at least one of p-type GaN and p-type AlGaN, a Mg concentration on the first layer side of the third layer being lower than a Mg concentration on the opposite side of the third layer from the first layer.

4. The device according to claim 1, wherein light emitted from the light emitting section has a peak wavelength in a range of 370 nanometers or more and 400 nanometers or less.

5. The device according to claim 1, wherein the light emitting section is provided on a GaN layer grown above a substrate having a sapphire c-plane via a single crystal buffer layer having a composition range of $Al_xGa_{1-x}N$ ($0.8 \leq x \leq 1$).

6. The device according to claim 5, wherein the single crystal buffer layer includes a first buffer layer and a second buffer layer, the second buffer layer being provided above the substrate, and the first buffer layer being provided between the second buffer layer and the substrate, the first buffer layer having a higher carbon concentration than the second buffer layer, and having a thickness of 3 nanometers or more and 20 nanometers or less.

7. A wafer comprising:
   a first layer made of at least one of n-type GaN and n-type AlGaN;
   a second layer made of Mg-containing p-type AlGaN, a Mg concentration in the second layer being $8 \times 10^{18}$ cm$^{-3}$ or more and $3 \times 10^{19}$ cm$^{-3}$ or less; and
   a light emitting section provided between the first layer and the second layer,
   the light emitting section including
     a plurality of barrier layers made of Si-containing $Al_xGa_{1-x-y}In_yN$ ($0 \leq x$, $0 \leq y$, $x+y \leq 1$), x being 0.06 or more and 0.08 or less, y being 0.003 or more and 0.01 or less, and
     a well layer provided between each pair of the plurality of barrier layers and made of GaInN or AlGaInN,
   the plurality of barrier layers having
     a nearest barrier layer nearest to the second layer among the plurality of barrier layers, and
     a far barrier layer, a Si concentration in the far barrier layer being $1.1 \times 10^{19}$ cm$^{-3}$ or more and $3 \times 10^{19}$ cm$^{-3}$ or less,
   wherein only the nearest barrier layer includes
     a first portion made of Si-containing $Al_xGa_{1-x-y}In_yN$ ($0 \leq x$, $0 \leq y$, $x+y \leq 1$), the first portion being in contact with the well layer, a Si concentration in the first portion being $1.1 \times 10^{19}$ cm$^{-3}$ or more and $3 \times 10^{19}$ cm$^{-3}$ or less and
     a second portion provided between the first portion and the second layer and made of $Al_xGa_{1-x-y}In_yN$ ($0 \leq x$, $0 \leq y$, $x+y \leq 1$), a Si concentration in the second portion being $1 \times 10^{16}$ cm$^{-3}$ or more and $9.0 \times 10^{18}$ cm$^{-3}$ or less, the second portion having a thickness of 3 nanometers or more and 9 nanometers or less, a Si concentration in the second portion being lower than a Si concentration in the first portion and lower than a Si concentration in the far barrier layer, and
   a Mg concentration on the light emitting section side of the second layer being higher than a Mg concentration on the opposite side of the second layer from the light emitting section.

* * * * *